United States Patent [19]

Grabbe

[11] Patent Number: 5,047,830
[45] Date of Patent: Sep. 10, 1991

[54] FIELD EMITTER ARRAY INTEGRATED CIRCUIT CHIP INTERCONNECTION

[75] Inventor: Dimitry G. Grabbe, Middletown, Pa.

[73] Assignee: AMP Incorporated, Harrisburg, Pa.

[21] Appl. No.: 526,877

[22] Filed: May 22, 1990

[51] Int. Cl.$^5$ .................... H01L 23/48; H01L 29/44; H01L 29/52
[52] U.S. Cl. ....................................... 357/68; 357/79; 357/75
[58] Field of Search ....................... 357/75, 79, 55, 68; 313/309, 310

[56] References Cited

U.S. PATENT DOCUMENTS

| | | | |
|---|---|---|---|
| 3,423,638 | 1/1969 | Dix et al. | 357/79 |
| 4,215,359 | 7/1980 | Schermer et al. | 357/70 |
| 4,513,308 | 4/1985 | Greene et al. | 357/55 |
| 4,748,483 | 5/1988 | Dahlberg | 357/15 |
| 4,857,161 | 8/1989 | Borel et al. | 204/192.26 |

FOREIGN PATENT DOCUMENTS 2413942  3/1973  Fed. Rep. of Germany ...... 313/309

OTHER PUBLICATIONS

"Electronic Engineering Times", Vacuum Semi R & D Picks Up, pp. 35, 38, Jan. 29, 1990.

Primary Examiner—Jerome Jackson, Jr.
Assistant Examiner—Donald L. Monin, Jr.

[57] ABSTRACT

A separable assembly for connecting and mounting an integrated circuit chip (10) to a chip carrier substrate (12) utilizing the principle of field emitter current induction. Transmitting zones (14, 26, 28) on the chip (10) and substrate (12) are formed as recessed arrays of field emitter projections (30, 32) and the respective receiving zones (24, 16, 18) are planar conductive films. The chip (10) and the substrate (12) are separably connected with the respective transmitting and receiving zones in alignment with each other.

7 Claims, 3 Drawing Sheets

FIELD EMITTER ARRAY INTEGRATED CIRCUIT CHIP INTERCONNECTION

BACKGROUND OF THE INVENTION

This invention relates to mounting and electrically connecting integrated circuit chips on a chip carrier substrate and, more particularly, to an arrangement for providing such mounting and electrical connecting by means of a separable assembly.

It is conventional to mount integrated circuit chips on a chip carrier substrate and to make electrical signal connections between pads on the chip and pads on the substrate by means of metallurgical bonding. Common bonding techniques include solder bumps and reflowing, wire bonding using thermocompression bonding, thermosonic bonding, tape automated bonding, etc. There are a number of disadvantages with such metallurgical bonding, mostly due to electromagnetic properties which introduce unwanted self-inductance, cross-talk, propagation delay and increased noise sensitivity. In addition, such metallurgical bonding severely limits the ability to replace chips on the carrier.

It is therefore a primary object of the present invention to provide an arrangement whereby an integrated circuit chip can be separably mounted on a carrier substrate and electrically connected thereto without the use of metallurgical bonds.

SUMMARY OF THE INVENTION

In accordance with the principles of this invention, there is provided an arrangement for the separable mounting of an integrated circuit chip on, and electrically connecting the chip to, a carrier substrate without any metallurgical bonding, this arrangement possessing no measurable self-inductance, no cross-talk or other unwanted electromagnetic properties. This arrangement comprises signal transmitting and receiving zones on the integrated circuit chip and on the carrier substrate. The transmitting/receiving zones of the chip are then placed in registration with the respective receiving/transmitting zones of the substrate. Each signal receiving zone comprises a planar film of conductive material. Each signal transmitting zone comprises a recessed area having a plurality of tapered projections extending upwardly from the floor of the recessed area. Communication from the transmitting zone to the receiving zone is effected through a field emitter induced current.

BRIEF DESCRIPTION OF THE DRAWINGS

The foregoing will be more readily apparent upon reading the following description in conjunction with the drawings in which like elements in different figures have the same reference numeral and wherein.

DETAILED DESCRIPTION

Figure 1:
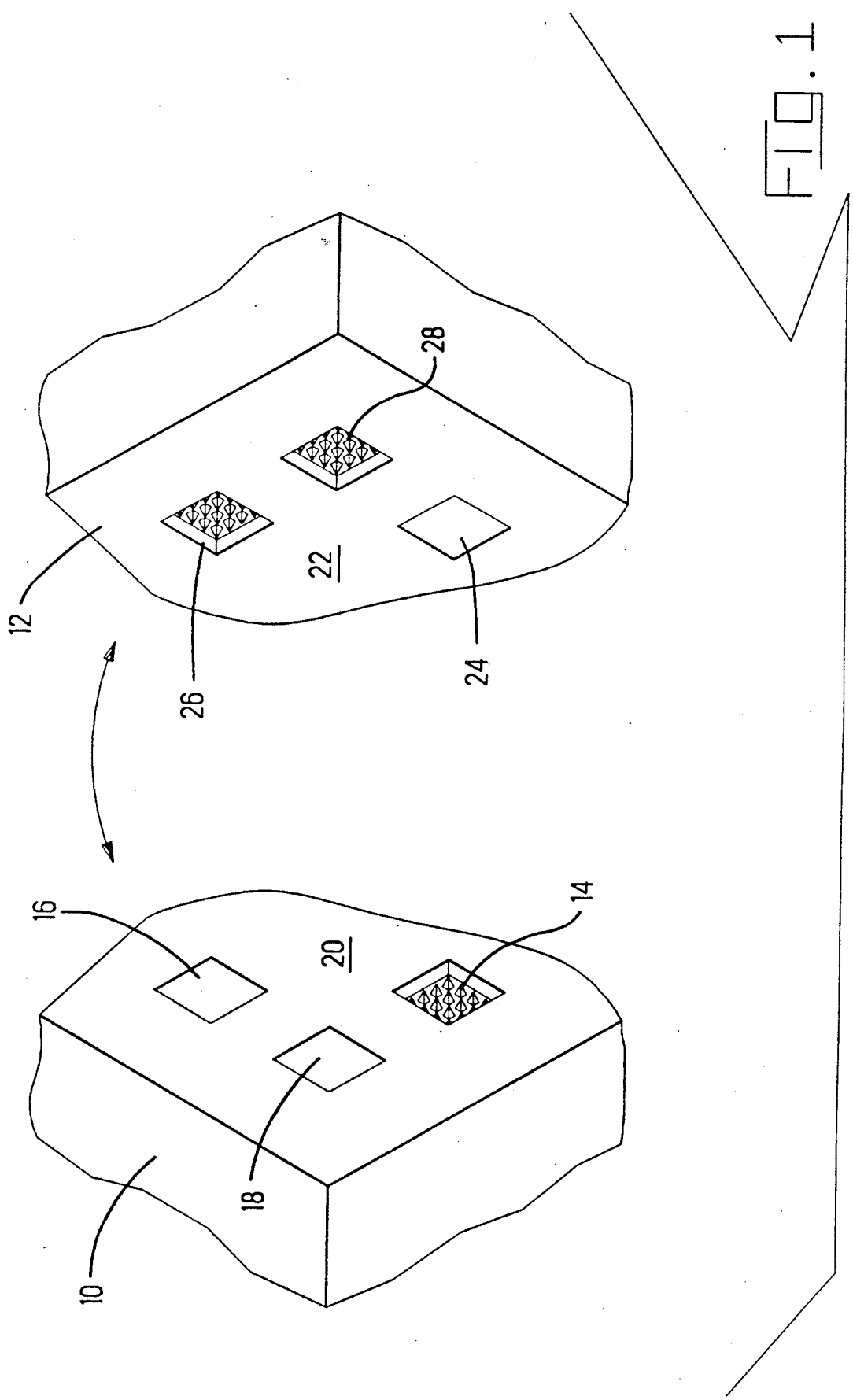
FIG. 1 illustrates, in perspective, portions of an integrated circuit chip and a chip carrier substrate arranged according to this invention.

Referring now to the drawings, FIG. 1 illustrates an integrated circuit chip 10 which is to be mounted on a chip carrier substrate 12. As is conventional, the substrate 12 may be a silicon module which is like a miniature printed circuit board on which an interconnection pattern (in one or more layers) and contact pads are deposited, this substrate being fabricated using the same processes as are used to fabricate integrated circuit chips. Such substrates may also contain integral line drivers and receivers or other active elements. Conventionally, the chip 10 would be electrically connected to the substrate 12 by means of wires extending between contact pads on the chip 10 and contact pads on the substrate 12, which wires would be metallurgically bonded to the respective contact pads. Other conventional means of electrically connecting the chip 10 include reflowing techniques, ultrasonic bonding and solder balls. The present invention contemplates elimination of the wires, solder, and metallurgical bonding by the application of the principle of field emitter current induction.

Signal transmission between contact pads on the chip 10 and contact pads on the substrate 12 is unidirectional. That is, a transmitting pad on the chip 10 is connected to a receiving pad on the substrate 12 and a transmitting pad on the substrate 12 is connected to a receiving pad on the chip 10. Therefore, the bidirectional current carrying capability of the wires can be replaced by the unidirectional current carrying capability of field emitter arrays, as will be described in full detail hereinafter.

Field emitter current induction is well known and has been described in the technical literature. Field emitter arrays have been used as a source of electrons in miniature vacuum electron tubes and as an electron beam source in electron microscopes. The field emitter arrays comprise a plurality of emitter tips, which are generally conically shaped projections, in an area corresponding to the transmitting pads of the chip 10 or the substrate 12. Each receiving pad comprises a planar conductive film, preferably gold. When the chip 10 is mounted on the substrate 12, the respective transmitting and receiving zones are placed in alignment with each other. By controlling the distance between the transmitting and receiving zones, it is possible to control the threshold voltage at which current flow is initiated.

As shown in FIG. 1, the integrated circuit chip 10 illustratively has a transmitting zone 14 and receiving zones 16 and 18 on its planar surface 20. Similarly, on the planar surface 22 of the substrate 12 there is a receiving zone 24 and transmitting zones 26 and 28. Each of the receiving zones 16, 18, and 24 includes a planar film of conductive material formed in the respective planar surfaces 20 and 22. Each of the Zones 14, 16, 18, 24, 26, 28, covers an area, for example, approximately two mils square. When the chip 10 is mounted on the substrate 12, the transmitting zone 14 of the chip 10 is in alignment with the receiving Zone 24 of the substrate 12; the receiving zone 16 of the chip 10 is in alignment with the transmitting zone 26 of the substrate 12; and the receiving zone 18 of the chip 10 is in alignment with the transmitting zone 28 of the substrate 12. Each of the transmitting zones 14, 26, 28 is an area recessed from the respective planar surface 20, 22. The recessed area has a floor and a plurality of tapered projections extending from the floor toward but not beyond the planar surface. These projections are preferably conical in shape.

The projections are of substantially equal height so that their tips lie along a plane parallel to and spaced from the planar surface 20 or 22. Preferably, the tips of the conical projections each have a radius in the range from about 3 to about 100 angstroms and are spaced greater than about 12 angstroms from the planar surfaces 20, 22.

Figure 2:
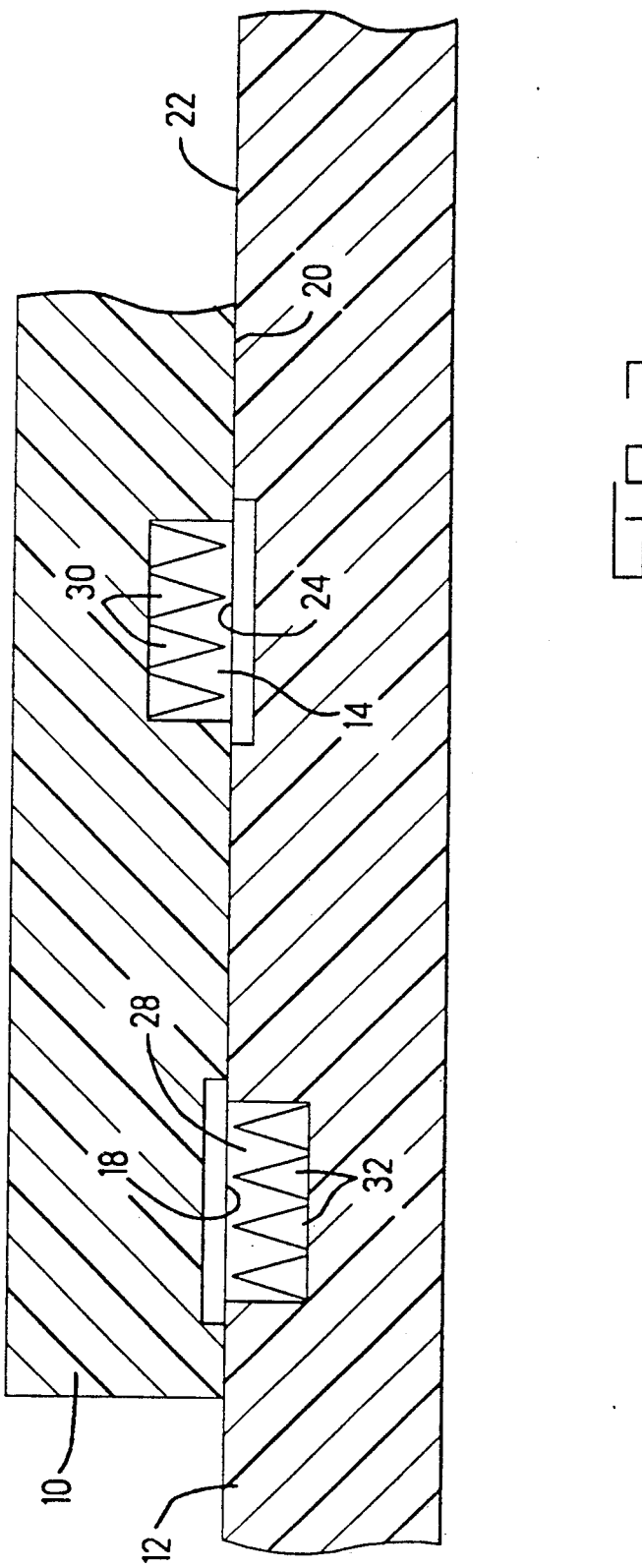
FIG. 2 is a simplified cross-sectional view showing the juxtaposition of the transmitting and receiving zones on the chip and the substrate according to this invention.

As shown in FIG. 2 (not to scale), the projections 30 in the transmitting zone 14 extend toward but do not reach the planar surface 22. Similarly the projections 32 of the transmitting zone 28 extend toward but do not reach the planar surface 22. The projections 30, 32 can be formed by any of several well known processes such as, for example, liquid etching, plasma etching, ion beam etching, electron beam etching, sometimes in combination with photolithographic processing. The receiving zones 18 and 24 shown in FIG. 2 are preferably formed by providing a thin planar film of gold or other conductive material by any of the well known techniques.

By controlling the distance between the plane formed by the tips of the projections and the plane of the receiving zone, the threshold voltage at which current flow between the projections and the receiving zone film is initiated is also controlled. From the mechanics of conduction, it is evident that the effective energy transfer is substantially unidirectional, from the transmitting zone to the receiving zone. Thus, a chip transmitting a signal through a field emitter array into the corresponding substrate receiver will have its circuitry inherently protected from the reflection of signals by the substrate. Accordingly, the impact of reflected signals onto the logic of the chip, which is a major problem in high speed logic, is eliminated by utilizing the aforedescribed mounting and connection arrangement.

Figure 3:
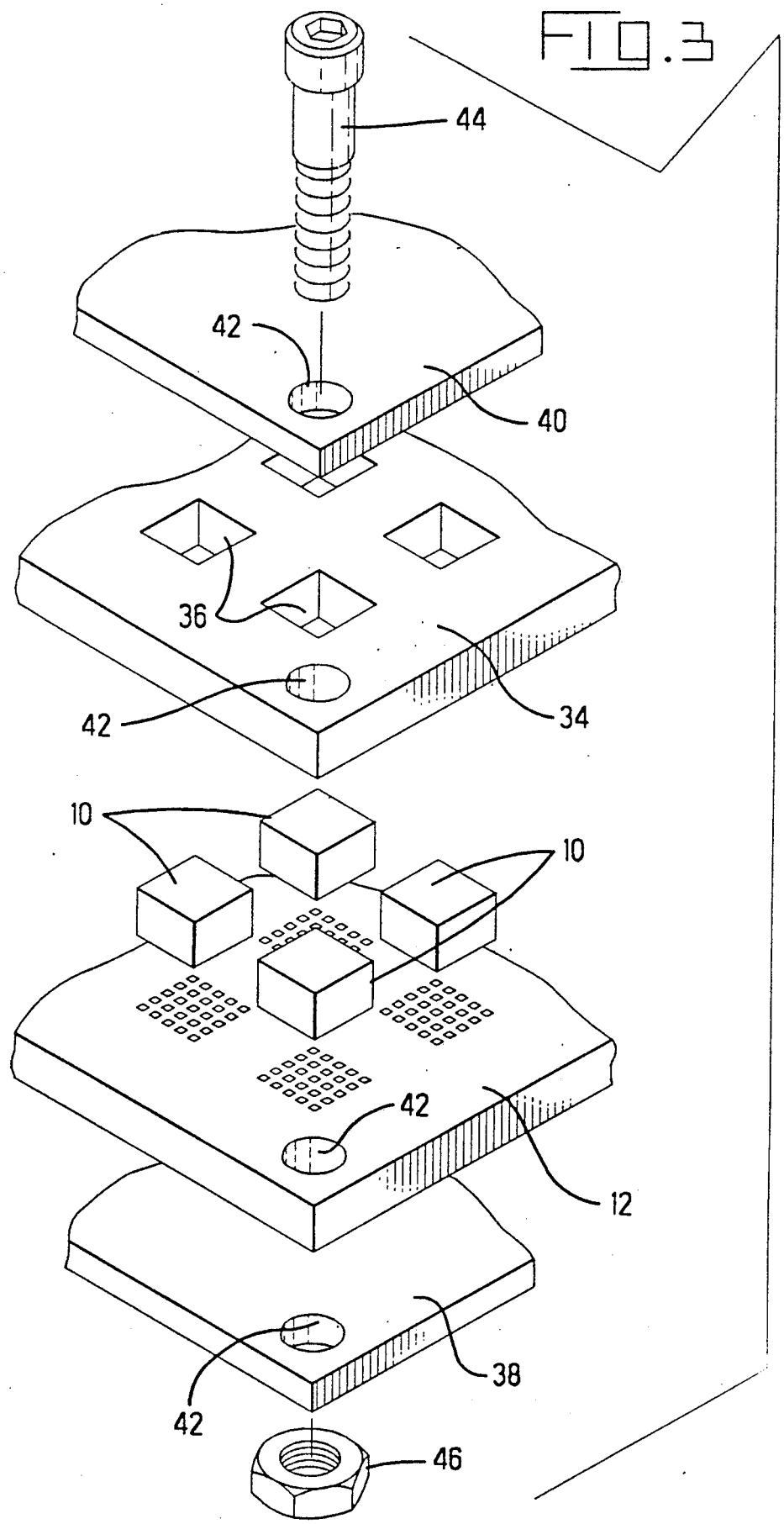
FIG. 3 is an exploded partial perspective view showing an illustrative complete assembly according to this invention.

FIG. 3 shows an illustrative assembly for separably mounting a plurality of integrated circuit chips 10 onto a chip carrier substrate 12. As shown in FIG. 3, there is provided a locating plate 34 having a plurality of spaced apertures 36 for holding the chips 10 in defined positions. Thus, the substrate 12 is formed with appropriately positioned transmitting and receiving zones, as described above, and the integrated circuit chips 10 are likewise formed with appropriately positioned transmitting and receiving zones so that when the chips 10 are placed in the apertures 36 and the locating plate 34 is appropriately aligned on the substrate 12, respective transmitting and receiving zones of the chips 10 and the substrate 12 are in proper alignment and registration with each other and the plane of the tips of the conical-shaped projections is parallel with the planar film of the respective receiving zone. There is further provided a lower clamping plate 38 and an upper heat sink and clamping plate 40. The heat sink 40, the locating plate 34, the substrate 12, and the lower clamping plate 38 are illustratively formed with apertures 42 which are so situated in their respective elements that they are in alignment when the heat sink 40, the locating plate 34, the substrate 12, and the lower clamping plate 38 are stacked with the respective transmitting and receiving zones of the chips 10 and the substrate 12 in alignment. Fasteners, such as a threaded bolt 44, may then be extended through the apertures 42 to hold the assembly together in a separable manner via the threaded nut 46. Although not shown, power and ground may be supplied to the chips 10 by metallizing the backs of the chips 10 and appropriately supplying power and ground to the metallized regions on the chips 10 through the heat sink 40.

Accordingly, there has been disclosed an arrangement for mounting and electrically connecting integrated circuit chips to a chip carrier substrate in a separable manner without the use of metallurgical bonds. While an illustrative embodiment has been disclosed, it will be apparent to those skilled in the art that various modifications to the disclosed embodiment may be made and it is only intended that the scope of this invention be limited by the appended claims.

I claim:

1. An assembly for providing a separable electrical path between an area on one substrate and an area on another substrate, comprising:
   a first substrate (10) having a first planar surface (20);
   a planar film (18) of conductive material covering a first predetermined area of said first planar surface (20);
   a second substrate (12) having a second planar surface (22), said second substrate being formed with a second predetermined area (28) recessed from said second planar surface, said recessed area having a floor, and a plurality of tapered projections (32) extending from said floor toward but not beyond said second planar surface, the distal ends of said projections lying substantially along a plane parallel to and spaced from said second planar surface; and
   means (34, 38, 40, 44, 46) for separably securing said first substrate to said second substrate with said first and second planar surfaces being in parallel superposed relationship and said first and second areas in registration one with the other.

2. The assembly according to claim 1 wherein said projections are conical in shape.

3. The assembly according to claim 2 wherein the tips of said conical projections each have a radius in the range from about 3 to about 100 angstroms.

4. The assembly according to claim 1 wherein the distal ends of said projections are spaced greater than about 12 angstroms from said second planar surface.

5. An assembly for providing a separable electrical path between an area on one substrate and an area on another substrate, comprising:
   a first substrate (10) having a planar film (18) of conductive material covering a first predetermined area thereof;
   a second substrate (12) having a second predetermined area (28) having a floor and a plurality of tapered projections (32) extending outwardly from said floor, the distal ends of said projections lying substantially along a plane;
   means (20, 22, 34, 38, 40, 44, 46) for separably securing said first substrate to said second substrate with said planar film (18) being in parallel superposed registration with, and spaced from said distal ends of said projections.

6. The assembly according to claim 5 wherein said distal ends of said projections each has a radius in the range from about 3 angstroms to about 100 angstroms.

7. The assembly according to claim 5 wherein said planar film (18) is spaced from said distal ends of said projections an amount greater than about 12 angstroms.

* * * * *